US008527941B2

(12) United States Patent
Clark (10) Patent No.: US 8,527,941 B2
(45) Date of Patent: *Sep. 3, 2013

(54) PROVIDING BLOCK STATE INFORMATION FOR A MODEL BASED DEVELOPMENT PROCESS

(75) Inventor: Martin Clark, Boston, MA (US)

(73) Assignee: The MathWorks, Inc., Natick, MA (US)

( * ) Notice: Subject to any disclaimer, the term of this patent is extended or adjusted under 35 U.S.C. 154(b) by 472 days.

This patent is subject to a terminal disclaimer.

(21) Appl. No.: 12/818,488

(22) Filed: Jun. 18, 2010

(65) Prior Publication Data

US 2010/0257506 A1    Oct. 7, 2010

Related U.S. Application Data

(63) Continuation of application No. 11/025,451, filed on Dec. 28, 2004, now Pat. No. 7,743,361.

(60) Provisional application No. 60/611,908, filed on Sep. 20, 2004.

(51) Int. Cl.
*G06F 9/44* (2006.01)

(52) U.S. Cl.
USPC ............... 717/105; 717/104; 717/135; 703/2; 703/6; 703/13

(58) Field of Classification Search
None
See application file for complete search history.

(56) References Cited

U.S. PATENT DOCUMENTS

| 4,914,568 | A | * | 4/1990 | Kodosky et al. | 715/763 |
|---|---|---|---|---|---|
| 5,408,597 | A |   | 4/1995 | Kita et al. |   |
| 5,610,828 | A | * | 3/1997 | Kodosky et al. | 716/139 |
| 5,903,759 | A | * | 5/1999 | Sun et al. | 717/128 |
| 5,980,096 | A | * | 11/1999 | Thalhammer-Reyero | 1/1 |
| 6,044,211 | A |   | 3/2000 | Jain |   |
| 6,182,024 | B1 |   | 1/2001 | Gangopadhyay et al. |   |
| 6,272,477 | B1 | * | 8/2001 | Kelly et al. | 706/5 |
| 6,285,971 | B1 | * | 9/2001 | Shah et al. | 703/2 |
| 6,356,256 | B1 | * | 3/2002 | Leftwich | 345/157 |
| 6,490,545 | B1 |   | 12/2002 | Peng |   |
| 6,606,588 | B1 | * | 8/2003 | Schaumont et al. | 703/15 |
| 6,668,203 | B1 |   | 12/2003 | Cook et al. |   |
| 6,683,624 | B1 | * | 1/2004 | Pazel et al. | 715/763 |
| 6,738,955 | B2 | * | 5/2004 | Andersen et al. | 716/136 |
| 6,751,583 | B1 | * | 6/2004 | Clarke et al. | 703/17 |
| 6,973,415 | B1 | * | 12/2005 | Saghier et al. | 702/186 |
| 6,993,462 | B1 | * | 1/2006 | Pavlovi et al. | 703/2 |
| 7,006,960 | B2 | * | 2/2006 | Schaumont et al. | 703/15 |
| 7,039,576 | B2 | * | 5/2006 | Akita | 703/19 |
| 7,120,896 | B2 | * | 10/2006 | Budhiraja et al. | 717/105 |
| 7,143,369 | B1 | * | 11/2006 | Milne | 716/102 |
| 7,168,072 | B2 | * | 1/2007 | Shah et al. | 717/154 |

(Continued)

OTHER PUBLICATIONS

Communications Blockset The Mathworks Inc. Natick, MA. Reference Version 2 © 2001-2002.*

(Continued)

*Primary Examiner* — Wei Zhen
*Assistant Examiner* — Matthew Brophy
(74) *Attorney, Agent, or Firm* — Nelson Mullins Riley & Scarborough LLP (57) ABSTRACT

A method and system for providing a block for use in a block diagram in a graphical modeling environment which is capable of outputting information regarding the dynamic state of the block.

18 Claims, 6 Drawing Sheets

(56) References Cited

U.S. PATENT DOCUMENTS

| | | | |
|---|---|---|---|
| 7,197,724 B2* | 3/2007 | Wheeler et al. | 716/106 |
| 7,206,732 B2* | 4/2007 | Williams et al. | 703/22 |
| 7,937,665 B1* | 5/2011 | Vazquez et al. | 715/763 |
| 2001/0034879 A1* | 10/2001 | Washington et al. | 717/1 |
| 2001/0035879 A1* | 11/2001 | Washington et al. | 345/763 |
| 2002/0052725 A1 | 5/2002 | Wasynczuk et al. | |
| 2002/0059053 A1* | 5/2002 | Akita | 703/13 |
| 2002/0083413 A1* | 6/2002 | Kodosky et al. | 717/109 |
| 2002/0116362 A1 | 8/2002 | Li et al. | |
| 2003/0084127 A1 | 5/2003 | Budhiraja et al. | |
| 2003/0216896 A1* | 11/2003 | Betts et al. | 703/2 |
| 2003/0216901 A1* | 11/2003 | Schaumont et al. | 703/13 |
| 2004/0039555 A1* | 2/2004 | Ulyanov et al. | 703/2 |
| 2004/0059556 A1* | 3/2004 | Allen et al. | 703/13 |
| 2004/0078180 A1* | 4/2004 | Allen et al. | 703/22 |
| 2004/0093194 A1 | 5/2004 | Singh et al. | |
| 2004/0172226 A1* | 9/2004 | Valley et al. | 703/2 |
| 2004/0210592 A1 | 10/2004 | Ciolfi et al. | |
| 2005/0114147 A1 | 5/2005 | Kumaran et al. | |
| 2006/0025973 A1 | 2/2006 | Kim | |
| 2006/0064291 A1 | 3/2006 | Pattipatti et al. | |

OTHER PUBLICATIONS

Using Simulink The Mathworks Inc. Natick, MA. Reference Version 3 © 1990-1999.*

Bitter, R.; Mohiuddin, T.; Nawrocki, M.; LabVIEW Advanced Programming Techinques CRC Press LLC, Boca Raton 2001.*

Barak, B. et al. "On the (Im)possibility of Obfuscating Programs." Advances in Cryptology—Crypto 2001, pp. 1-42.

Baier, B. "COBF: The C/C++ Sourcecode Obfuscator." Retrieved from the Internet: http://home.arcor.de/bernhard.baier, pp. 1-15. Retrieved on Mar. 22, 2005.

Cloakware Corporation, Inc. "Cloakware Security Suite." Retrieved from the Internet: www.cloakware.com/products/suite.html, 3 pp. Retrieved on Mar. 22, 2205.

MathWorks, "Using Simulink, version 5," The MathWorks, Inc., (2002).

Semantic Designs. "Source Code Obfuscators." Retrieved from the Internet: www.semdesigns.com/products/obfuscators/index.html, 3 pp. Retrieved on Mar. 22, 2005.

"Stunnix CXX-Obfus—The Obfuscator for C and C++ Source Code." Retrieved from the internet: www.stunnix.com/prod/cxxo/overview.shtml, 6 pp. Retrieved on Mar. 22, 2005.

"Stunnix JavaScript Obfuscator—Obfuscate JavaScript Source Code." Retrieved from the Internet: www.stunnix.com/prod/jo/overview.shtml, 9 pp. Retrieved on Mar. 22, 2005.

"Stunnix Perl-Obfus—The Obfuscator for Perl Source Code." Retrieved from the Internet: www.stunnix.com/prod/po/overview.shtml, 8 pp. Retrieved on Mar. 22, 2005.

"Stunnix VBS-Pbfus—The Obfuscator for VBScript Source Code." Retrieved from the Internet: www.stunnix.com/prod/vbso/overview.shtml, 8 pp. Retrieved on Mar. 22, 2005.

International Search Report for Application No. PCT/US2005/033847, dated Apr. 12, 2006.

* cited by examiner

PROVIDING BLOCK STATE INFORMATION FOR A MODEL BASED DEVELOPMENT PROCESS

REFERENCE TO RELATED APPLICATION

The present invention is a continuation of U.S. patent application Ser. No. 11/025,451, filed Dec. 28, 2004, entitled "Providing Block State Information for a Model Based Development Process," which claims priority to U.S. Provisional Patent Application, Ser. No. 60/611,908, filed Sep. 20, 2004, entitled "Providing Block State Information for a Model Based Development Process," the contents of which are incorporated herein by reference.

FIELD OF THE INVENTION

The present invention relates to a graphical modeling environment for modeling a dynamic system. More particularly, the present invention relates to providing state information for blocks in the graphical modeling environment.

BACKGROUND OF THE INVENTION

Many organizations are embracing the paradigm of Model Based Development in their production processes. "Model Based Development" refers to the practice of specifying, analyzing, and implementing systems using a common "model" consisting of a set of block diagrams and associated objects. System implementation typically consists of auto-matically generating code for portions of the model, particularly portions corresponding to the system's control algorithm.

Graphical modeling environments are an example of software applications that may enable a user to model dynamic systems i.e., systems whose outputs change over time, using a graphical model, such as a block diagram. Some graphical modeling environments also enable simulation and analysis of models. Simulating a dynamic system in a graphical modeling environment is typically a two-step process. First, a user creates a graphical model, such as a block diagram, of the system to be simulated. A graphical model may be created using a graphical user interface, such as a graphical model editor. The graphical model depicts time-based relationships between the systems inputs, states, parameters and outputs. After creation of the graphical model, the behavior of the dynamic system over a specified time period is simulated using the information entered into the graphical model. In this step, the graphical model is used to compute and trace the temporal evolution of the dynamic systems' outputs ("execute the graphical model"), and automatically produce either deployable software systems or descriptions of hardware systems that mimic the behavior of either the entire model or portions of the model (code generation).

Block diagrams are graphical entities having an "executable meaning" that are created within graphical modeling environments for modeling a dynamic system, and generally comprise one or more graphical objects. For example, a block diagram model of a dynamic system is represented schematically as a first collection of graphical objects, such as nodes, which are interconnected by another set of graphical objects, generally illustrated as lines, which represent logical connections between the first collection of graphical objects. In most block diagramming paradigms, the nodes are referred to as "blocks" and drawn using some form of geometric object (e.g., circle, rectangle, etc.). The line segments are often referred to as "signals". Signals correspond to the time-varying quantities represented by each line connection and are assumed to have values at each time instant. Each node may represent an elemental dynamic system, and the relationships between signals and state variables are defined by sets of equations represented by the nodes. Inherent in the definition of the relationship between the signals and the state variables is the notion of parameters, which are the coefficients of the equations. These equations define a relationship between the input signals, output signals, state, and time, so that each line represents the input and/or output of an associated elemental dynamic system. A line emanating at one node and terminating at another signifies that the output of the first node is an input to the second node. Each distinct input or output on a node is referred to as a port. The source node of a signal writes to the signal at a given time instant when its system equations are solved. The destination node of this signal read from the signal when their system equations are being solved. Those skilled in the art will recognize that the term "nodes" does not refer exclusively to elemental dynamic systems but may also include other modeling elements that aid in readability and modularity of block diagrams.

In some instances, during simulation, a user may wish to evaluate a performance of particular component or block in the system. Typically this is done by monitoring the signal received by the block and the signal output by the block. Thus the behavior of the block can be seen from the output resulting from a specific input. A drawback of this method is that, in some applications, why a particular output resulted from a particular input cannot be determined without knowing the state of the block.

SUMMARY OF THE INVENTION

The present invention provides state information of a block in a block diagram of a dynamic system. The state information is provided by performing a functional transform on the state information and outputting the result. The outputted result may be shown visually, or outputted to a data file In accordance with a first aspect, in a graphical modeling environment, a method comprises providing a model of a dynamic system wherein a selected entity in the graphical model contains state information, performing a functional transformation on the state information, and outputting the result of the functional transformation by reference.

In accordance with another aspect, the present invention provides a method, and a medium holding electronic-device-executable instructions for the method. The method comprises the steps of providing a block diagram model of a dynamic system, wherein a selected block in the block diagram model contains state information; and outputting the state information from the block.

In accordance with another aspect, a system for generating and displaying a graphical programming language is provided. The system comprises user-operable input means for inputting data to the graphical programming application, a display device for displaying a graphical model and an electronic device including memory for storing computer program instructions and data, and a processor for executing the stored computer program instructions. The computer program instructions include instructions for providing a model of a dynamic system wherein a selected entity in the graphical model contains state information; performing a functional transformation on the state information; and outputting the result of the functional transformation by reference.

In accordance with another aspect, in a graphical modeling environment, a block diagram model of a dynamic system comprises an input signal; a block, in communication with the input signal, containing state information; and an output signal in communication with the block.

In accordance with another aspect, in a graphical modeling environment, a method comprises the steps of providing a block diagram model of a dynamic system, wherein a selected filter block in the block diagram model contains state information; performing a functional transformation on the state information, and outputting the result of the transformation from the filter block.

In accordance with another aspect, in a graphical modeling environment, a block, for use in a block diagram model of a dynamic system, comprises an input port for receiving signals for the block, an output port for outputting signals in response to signals received by the block, and state information reflecting the dynamic state of the block.

In accordance with another aspect, a system for generating and displaying a graphical modeling application, comprises a distribution server for providing to a client device a block containing state information; and a client device in communication with the distribution server.

In accordance with another embodiment, in a network having a server, executing a graphical modeling environment, and a client device in communication with the server, a method comprises the steps of providing, at the server, a block diagram model of a dynamic system; receiving, at the server from the client device, a selection of a block, in the block diagram model, containing state information, performing a functional transformation on the state information, and outputting, from the server to the client device, the result of the transformation from the selected block.

DETAILED DESCRIPTION OF A ILLUSTRATIVE EMBODIMENT

An illustrative embodiment of the present invention relates to generating and providing dynamic state information for a block in a communication system model. The present invention will be described relative to illustrative embodiments. Those skilled in the art will appreciate that the present invention may be implemented in a number of different applications and embodiments and is not specifically limited in its application to the particular embodiments depicted herein.

Figure 1A:
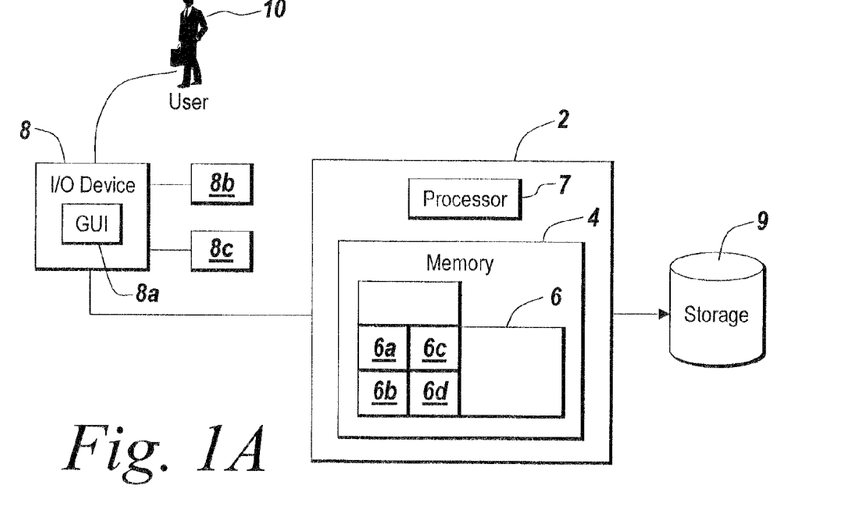
FIG. 1A illustrates an environment suitable for practicing an illustrative embodiment of the present invention.

FIG. 1A depicts an environment suitable for practicing an illustrative embodiment of the present invention. An electronic device 2 includes memory 4, on which software according to one embodiment of the present invention is stored, a processor (CPU) 7 for executing software stored in the memory, and other programs for controlling system hardware. Typically, the interaction of a human user with the electronic device 2 occurs through an input/output (I/O) device 8, such as a graphical user interface (GUI). The I/O device 8 may include a display device 8a (such as a monitor) and an input device (such as a mouse 8b and a keyboard 8c and other suitable conventional I/O peripherals.

For example, the memory 4 holds a diagramming application 6 capable of creating and simulating electronic versions of system diagrams, such as block diagrams, state diagrams, signal diagrams, flow chart diagrams, sequence diagrams, UML diagrams, dataflow diagrams, circuit diagrams, ladder logic diagrams, kinematic element diagrams, or other models, which may be displayed to a user 10 via the display device 8a. In the illustrative embodiment, the diagramming application 6 comprises a block diagram environment, such as Simulink® or another suitable other graphical modeling environment. As used herein, the terms "block diagram environment" and "graphical modeling environment" refer to a graphical application where a model is translated into executable instructions. Examples of suitable diagramming applications include, but are not limited to MATLAB, version 6.1 with Simulink, version 6.0 from the MathWorks, LabVIEW, DasyLab and DiaDem from National Instruments Corporation, VEE from Agilent, SoftWIRE from Measurement Computing, VisSim from Visual Solutions, SystemVIEW from Elanix, WiT from Coreco, Vision Program Manager from PPT Vision, Khoros from Khoral Research, and numerous others. The memory 4 may comprise any suitable installation medium, e.g., a CD-ROM, floppy disks, or tape device; a computer system memory or random access memory such as DRAM, SRAM, EDO RAM, Rambus RAM, etc.; or a non-volatile memory such as a magnetic media, e.g., a hard drive, or optical storage. The memory may comprise other types of memory as well, or combinations thereof.

In an alternate embodiment, the electronic device 2 is also interfaced with a network, such as the Internet. Those skilled in the art will recognize that the diagrams used by the diagramming application 6 may be stored either locally on the electronic device 2 or at a remote location 9 interfaced with the electronic device over a network. Similarly, the diagramming application 6 may be stored on a networked server or a remote peer.

The diagramming application 6 of an illustrative embodiment of the invention includes a number of generic components. Although the discussion contained herein focuses on Simulink, version 6.0 (Release 14) from The MathWorks, Inc. of, Natick Mass., those skilled in the art will recognize that the invention is applicable to other software applications. The generic components of the illustrative diagramming program 6 include a block diagram editor 6a for graphically specifying models of dynamic systems. The block diagram editor 6a allows users to perform such actions as construct, edit, display, annotate, save, and print out a graphical model, such as a block diagram, that visually and pictorially represents a dynamic system. The illustrative diagramming application 6 also includes graphical entities 6b, such as signal lines and buses that represent how data is communicated between functional and non-functional units, and blocks 6c. As noted above, blocks are the fundamental mathematical elements of a classic block diagram model. A block diagram execution engine 6d, also implemented in the application, is used to process a graphical model to produce simulation results or to convert the graphical model to executable code. For a block diagram graphical model, the execution engine 6d translates a block diagram to executable entities following the layout of the block diagram as provided by the user. The executable entities are compiled and executed on an electronic device, such as a computer, to implement the functionality specified by the model. Typically, the code generation preserves a model hierarchy in a call graph of the generated code. For instance, each subsystem of a model in a block diagram environment can map to a user specified function and the generated code. Real-Time Workshop from the MathWorks, Inc. of Natick, Mass. is an example of a suitable execution engine 6d for generating code.

In the illustrative embodiment, the diagramming program 6 is implemented as a companion program to a technical computing program 11, such as MATLAB, also available from the MathWorks, Inc.

Figure 1B:
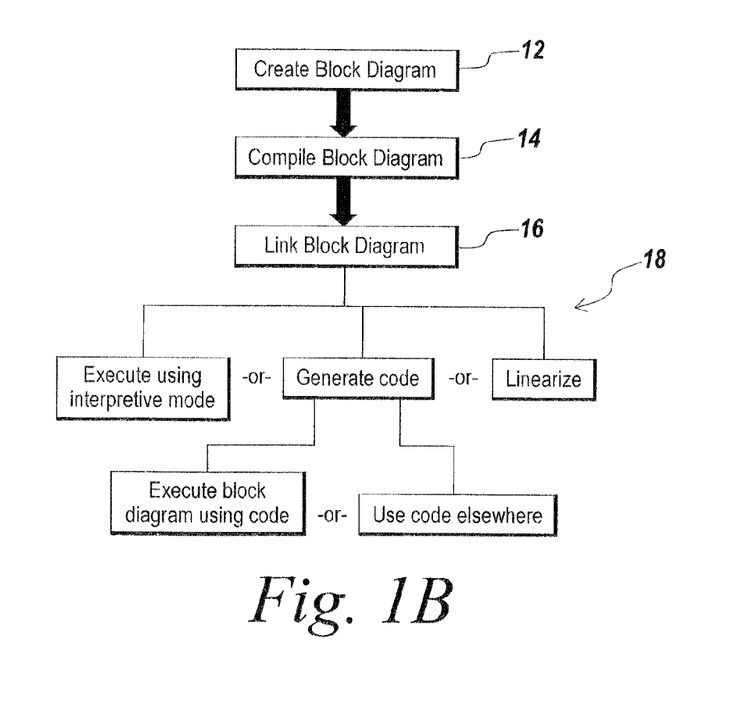
FIG. 1B is a flow chart illustrating the steps involved in simulating a dynamic system using the environment shown in FIG. 1A.

FIG. 1B is a flow chart diagramming the steps involved in simulating a dynamic system according to an illustrative embodiment of the invention. In step 12, a user creates a block diagram model representing a dynamic system. Once a block diagram model, or other graphical model, has been constructed using the editor 6a in step 12, the execution engine 6d simulates the model by solving equations defined by the model to trace the system outputs as a function of time, in steps 14-18. The solution of the model, which may be referred to as model execution, is carried out over a user-specified time span for a set of user-specified inputs. After creating the block diagram model in step 12, the execution engine 6d compiles the block diagram in step 14. Then, in step 16, the execution engine links the block diagram in to produce an "in-memory executable" version of the model. In step 18, the execution engine uses the "in-memory executable" version of the model to generate code in step 22 and/or simulate a block diagram model by executing the model in step 24 or 20, or linearizing a block diagram model in step 30, as described in detail below.

The block diagram editor 6a is the graphical user interface (GUI) component that allows a user to create and modify a block diagram model representing a dynamic system, in step 12. The blocks in the electronic block diagram may model the behavior of specialized mechanical, circuit or software components, such as motors, servo-valves, power plants, blocks, tires, modems, receivers, and other dynamic components. The block diagram editor 6a also allows a user to create and store data relating to graphical entities 6b. In Simulink®, a textual interface with a set of commands allows interaction with the graphical editor. Using this textual interface, users may write special scripts that perform automatic editing operations on the block diagram. A user generally interacts with a set of windows that act as canvases for the model. There is generally more than one window for a model because models may be partitioned into multiple hierarchical levels through the use of subsystems.

A suite of GUI tools within the block diagram editor 6a allows users to draft a block diagram model on the corresponding windows. For example, in Simulink® the GUI tools include a block palette, a wiring line connection tool, an annotation tool, a formatting tool, an attribute editing tool, a save/load tool and a publishing tool. The block palette is a library of all the pre-defined blocks available to the user for building the block diagram. Individual users may be able to customize this palette to: (a) reorganize blocks in some custom format, (b) delete blocks they do not use, and (c) add custom blocks they have designed. The palette allows blocks to be dragged through some human-machine interface (such as a mouse or keyboard) from the palette on to the window (i.e., model canvas). The graphical version of the block that is rendered on the canvas is called the icon for the block. There may be different embodiments for the block palette including a tree-based browser view of all of the blocks.

Figure 2:
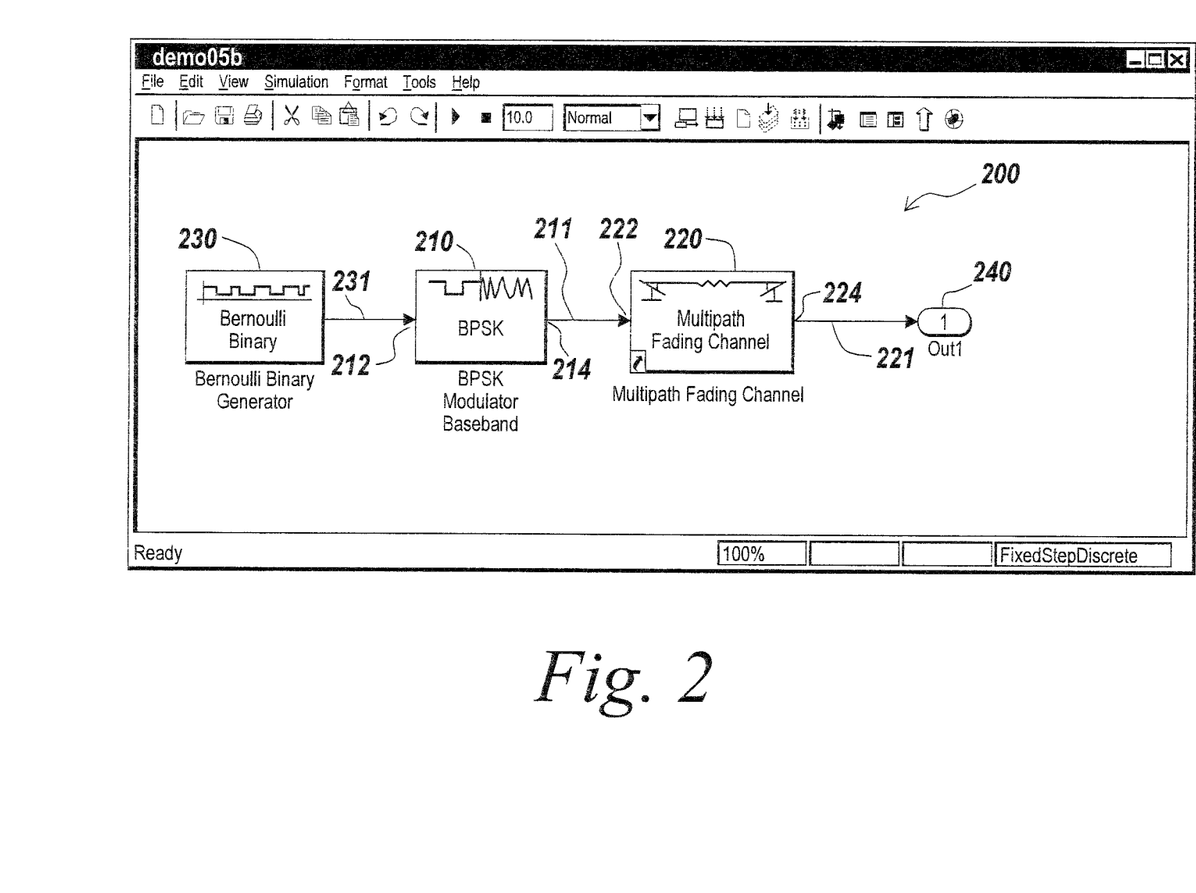
FIG. 2 is an example of a block diagram of a dynamic system in a graphical modeling environment.

A block diagram model of a dynamic system, created during step 12, is generally represented schematically as a collection of interconnected graphical objects, such as blocks, ports and lines, which represent signals. FIG. 2 illustrates an example of a block diagram 200 created using the diagramming application 6. Each block in the block diagram 200 represents an elemental dynamic system. Each signal, denoted by lines connecting the blocks, represents the input and/or output of an elemental dynamic system. The illustrative block diagram 200 also includes a subsystem blocks 210, 220, a source block 230 and a destination block 240. A line emanating at one block and terminating at another signifies that the output of the first block is an input to the second block. A port, such as input ports 212, 222 and output ports 214, 224 of the subsystem blocks, refer to a distinct inputs or outputs on a block. Signals correspond to the time-varying quantities represented by each line connection and are assumed to have values at each time instant. The source block 230 for a signal 231 writes to the signal at a given time instant when its system equations are solved. In the illustrative embodiment, the source block 230 is a Bernoulli Binary Generator. As shown, the signal 231 from the source block passes to the first subsystem 210, which is a BPSK Modulator Baseband block. The signal 211 outputted from the first subsystem passes to the second subsystem 220, which is Multipath Fading Channel block. The destination block 230 for a signal 221 reads from the signal 221 when the system equation is being solved. As shown, the signal 221 represents the output of the second subsystem 220. One skilled in the art will recognize that the block diagram 200 is merely illustrative of a typical application and is not intended to limit the present invention in any way.

Once a block diagram model, or other graphical model, has been constructed using the editor 6a in step 12, the execution engine 6d simulates the model by solving equations defined by the model to trace the system outputs as a function of time, in steps 14-18. The solution of the model, which may be referred to as model execution, is carried out over a user-specified time span for a set of user-specified inputs.

The compile stage in step 14 marks the start of model execution and involves preparing data structures and evaluating parameters, configuring and propagating block characteristics, determining block connectivity, and performing block reduction and block insertion. The compile stage involves checking the integrity and validity of the block interconnections in the block diagram. In this stage, the engine 6d also sorts the blocks in the block diagram into hierarchical lists that are used when creating the block method execution lists. The preparation of data structures and the evaluation of parameters create and initialize basic data-structures needed in the compile stage. For each of the blocks, a method forces the block to evaluate all of its parameters. This method is called for all blocks in the block diagram. If there are any unresolved parameters, execution errors are thrown at this point.

During the configuration and propagation of block and port/signal characteristics, the compiled attributes (such as dimensions, datatypes, complexity, or sample time) of each block (and/or ports) are setup on the basis of the corresponding functional attributes and the attributes of blocks (and/or ports) that are connected to the given block through lines. The attribute setup is performed through a process during which block functional attributes "ripple through" the block diagram from one block to the next following signal connectivity. This process (referred to herein as "propagation"), serves two purposes. In the case of a block that has explicitly specified its block (or its ports') functional attributes, propagation helps ensure that the attributes of this block are compatible with the attributes of the blocks connected to it. If not, an error is issued. For example, if an Integrator block is implemented to only accept numbers of double precision datatype, then this block will error out if it is driven by a block that produces single precision data, unless the user has asked for an implicit data conversion. Secondly, in many cases blocks are implemented to be compatible with a wide range of attributes. Such blocks adapt their behavior in accordance with the attributes of the blocks connected to them. This is akin to the concept of polymorphism in object-oriented programming languages. For instance, a discrete-time Block filter could be implemented to accept any of the standard integer datatypes ranging from 8-bit to 128-bit. The exact implementation of the block is chosen on the basis of the specific block diagram in which this block finds itself. Included within this step are other aspects such as validating that all rate-transitions within the model yield deterministic results and that the appropriate rate transition blocks are being used.

The compilation step also determines actual block connectivity. Virtual blocks play no semantic role in the execution of a block diagram. During compilation, the virtual blocks and signals, such as virtual bus signals, in the block diagram are optimized away (removed) and the remaining non-virtual blocks are reconnected to each other appropriately. This compiled version of the block diagram with actual block connections is used from this point forward in the execution process.

Once actual block connectivity has been determined (by removing the virtual blocks) the block diagram may be further optimized by performing block reduction and insertion. During this step, blocks may be inserted or a set of non-virtual blocks may be completely removed or reduced to a single equivalent block. Block insertion and reduction is mainly done to improve execution efficiency.

In the link stage, in step 16, the execution engine 6d uses the result of the compilation stage to allocate memory needed for the execution of the various components of the block diagram. The linking stage also produces block method execution lists, which are used by the simulation or linearization of the block diagram. Included within the link stage is the initialization of the model, which consists of evaluating "setup" methods (e.g. block start, initialize, enable, and constant output methods). The block method execution lists are generated because the simulation and/or linearization of a model must execute block methods by type (not by block) when they have a sample hit.

The compiled and linked version of the block diagram may be directly utilized to execute the model over the desired time-span, in step 18. According to one aspect, after linking has been performed, step 18 comprises the execution engine 6d generating code in step 22 to produce software from the block diagram. In this stage, the execution engine may choose to translate the block diagram model (or portions of it) into either software modules or hardware descriptions (broadly termed code). The code generated by the execution engine could be in a number of possible forms in step 22. The code may be instructions in a high-level software language such as C, C++, Ada, etc., hardware descriptions of the block diagram portions in a language such as HDL, or custom code formats suitable for interpretation in some third-party software. Alternatively, the code may be instructions suitable for a hardware platform such as a microprocessor, microcontroller, or digital signal processor, etc., a platform independent assembly that can be re-targeted to other environments, or just-in-time code (instructions) that corresponds to sections of the block diagram for accelerated performance.

If this stage of generating code is performed, then the stages that follow use the generated code during the execution of the block diagram in step 24. Alternatively, the execution engine skips generating code in step 18 and uses an interpretive mode of execution for the block diagram in step 20. In another embodiment, the execution engine 6d only generates code in step 18. For example, in certain circumstances, a user may not proceed further with the execution of the block diagram after generating code, because he would like to deploy the code outside the confines of the block diagram software, in step 28.

Upon reaching the simulation stage, the execution engine 6d uses a simulation loop to execute block methods in a pre-defined ordering upon a sample hit to produce the system responses they change with time.

According to an illustrative embodiment of the invention, the diagramming application 6 allows the use of selected entities that contain state information. The state information is provided by performing a functional transformation on the state information and outputting the result of the transformation during simulation. An example of such an entity is the second subsystem block 220, the Multipath Fading Channel block, as shown in FIG. 2.

The result of a transformation is typically outputted by reference as opposed to on an output port or signal. Thus there is no visually depicted signal or output port in the modeled dynamic system for the transformation result. The result is instead outputted to a graphical display or data file. In some embodiments the output may be color coded to identify the block providing the output.

Figure 3:
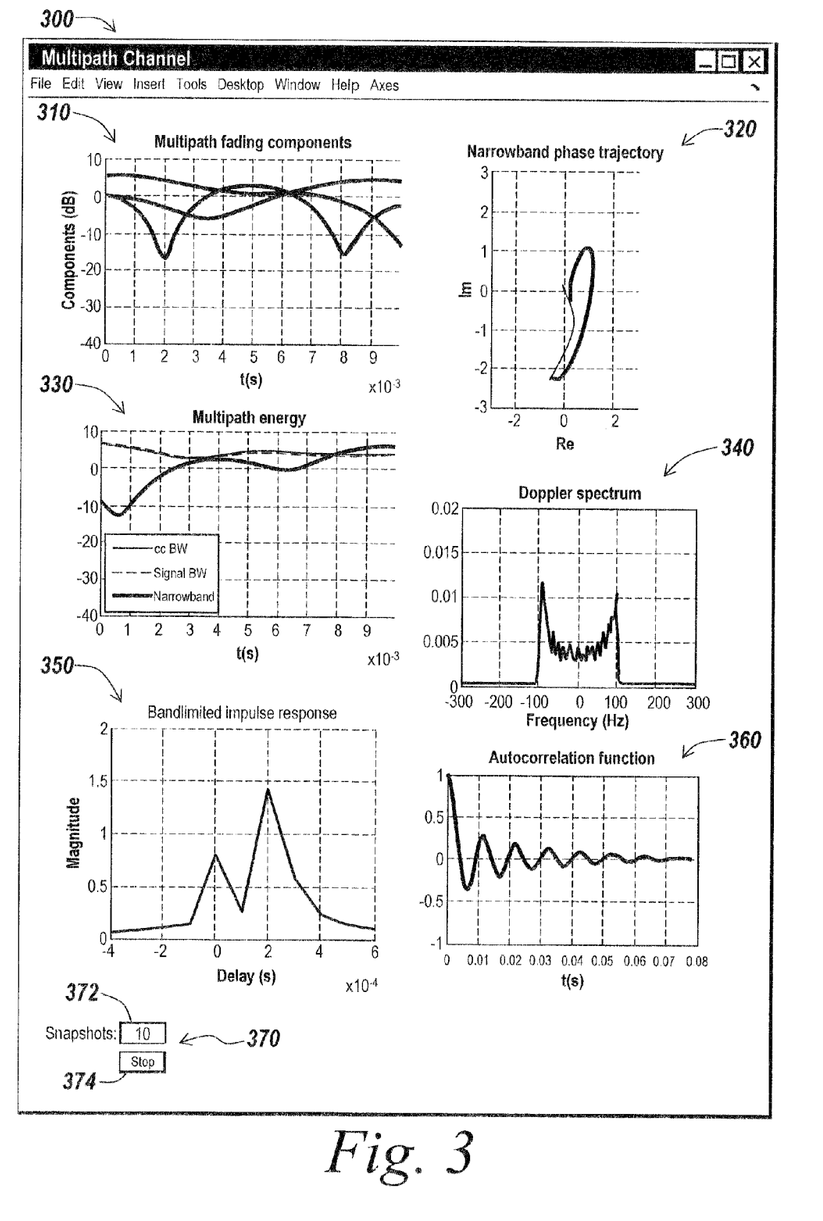
FIG. 3 is an example of a graphical display of outputted state information from the selected bock depicted in the block diagram of FIG. 2.

The graphical display may contain graphics, text or a combination of both. An example of such a graphical display of transformation results can be seen in FIG. 3. The graphical display 300, also referred to here as a visualization or "on-the-fly-visualization," displays the transformation results 310, 320, 330, 340, 350, 360 of the Multipath Fading Channel block 220 shown in FIG. 2. In this example, the results being displayed comprises Multipath fading components 310, Narrowband phase trajectory 320, Multipath energy 330, Doppler spectrum 340, Bandlimited impulse response 350, and Autocorrelation function 360. It should be noted, however, that these are but some of the possible types of functional transformations that can be performed and outputted. Other types of block may have other types of functional transforms. The functional transform performed may be trivial as an identity transformation or involve several stages of complexity. Possible types of transforms may include, but are not limited to, path gain evolution; matched filter bound; phasor trajectories, and composite narrow band trajectory; channel block impulse response; channel frequency response; scattering function; power delay profile; Doppler spectrum, frequency correlation function; time correlation function; mean delay; RMS delay spread; mean Doppler shift; RMS Doppler shift; coherence bandwidth; coherence time; fade distribution; level crossing rate; average fade duration; and zero crossing rate.

The graphical display may also provide other information about the about the state information being displayed, as well as method of controlling the display, such as starting and stopping the display. An example of this can be seen at 370 in FIG. 3, wherein the number of snapshots used to make the display is shown 372 as well as a control allowing the display to be stopped 374. Other controls may be implemented such as allowing the displays to be shifted back and forth though time such as through the use of a slider. In some applications, the user may be provided with the ability to modify the state of a block from the graphical display.

Figure 4:
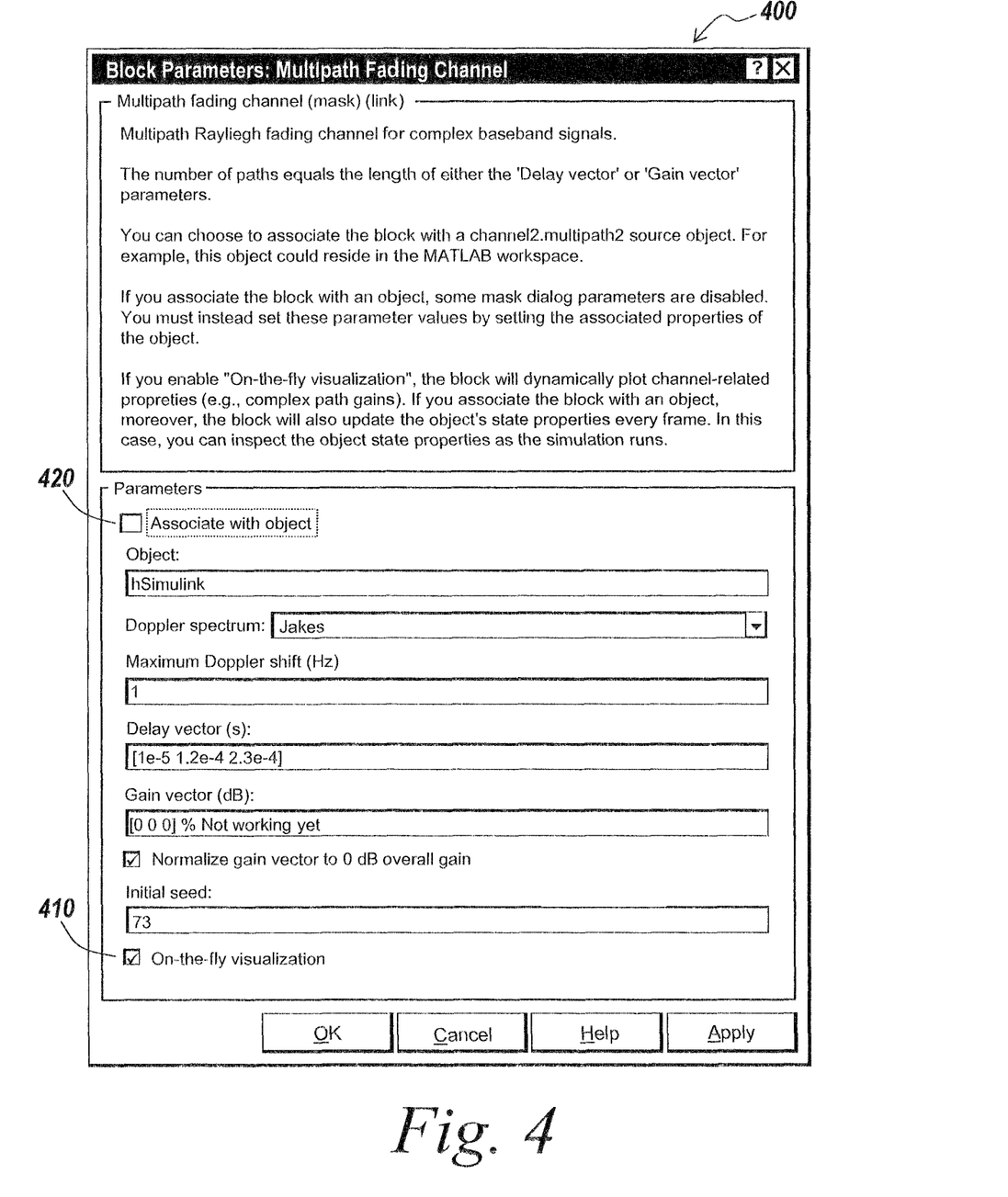
FIG. 4 is an example of a dialog box providing a graphic user interface for the properties of the selected block depicted in the block diagram of FIG. 2.

In accordance with some embodiments, a user may select whether a functional transformation on state information is performed and outputted. This may be accomplished via a graphical user interface such as a dialog box. An example of such a dialog box can be seen in FIG. 4. The dialog box 400 shown here displays the block parameters for the Multipath Fading Channel block 220 shown in FIG. 2. In the example shown in FIG. 4, the user has the option of having results of one or more transformations outputted to a graphical display, referred to here as "on-the-fly-visualization," by using a check box 410. In some embodiments the user may choose which results will be outputted.

In some applications, where a select entity may represent a subsystem comprising other entity, the user may have the option of outputting the results of functional transforms performed on the state information of the entities in the subsystem represented by the selected entity. In this manner, transformation results from any entity in the hierarchy of systems may be outputted.

In some applications it may also be beneficial to be able to set criteria, conditions, or parameters that would activate the performing of transformations and outputting of results. For example, the user could set the block to perform a transform an output results when certain performance thresholds are met. These criteria could be based on an input signal, output signal, or the state of the block.

In accordance with another embodiment, the result of a transformation on state information of an entity may be outputted to a data file. One example of a data file is an object in MATLAB. The associating of a block with an object allows the control of properties of the block using the parameters of the object. The object may also be updated as the state of the block changes. The performance of functional transforms and output of results to a data file may also be done in conjunction with outputting the results to a graphical display. As with the graphical display a user may select the output to a data file using a graphical user interface such as a dialog box. An example of such a dialog box can be seen in FIG. 4. The dialog box 400 shown here allows the option of associating the block with an object by providing a check box 420. An example of an object in the MATLAB workspace that has been associated with the Multipath Fading Channel block 220 of FIG. 2, using the check box 420 in dialog box 400 shown in FIG. 4 can be seen below:

Object in MATLAB Workspace:

```
hSimulink =
            EnableProbe: 0
              ProbeFcn: @channelgraphics2
            ObjectLocked: 0
          NumSampOutput: 0
            ChannelType: 'Multipath'
        InputSamplePeriod: 2.0000e-004
          MaxDopplerShift: 100
              PathDelays: [1.0000e-005 1.2000e-004 2.3000e-004]
            AvgPathGaindB: [0 0 0]
        NormalizePathGains: 0
                KFactor: 0
                PathGains: [0.5684+ 0.3201i −0.2217+ 0.4565i −0.1582+ 0.2036i]
        ChannelFilterDelay: 4
            RayleighFading: [1x1 channel2.rayleighfading]
            ChannelFilter: [1x1 channel2.channelfilter]
          PathGainHistory: [1x1 channel2.slidebuffer]
      ResetBeforeFiltering: 0
      NumSamplesProcessed: 0
```

Rayleigh Fading Component Object:

```
>> hSimulink.RayleighFading
ans =
            EnableProbe: 1
              ProbeFcn: [ ]
            ObjectLocked: 1
          NumSampOutput: 0
        OutputSamplePeriod: 1.0000e-004
          CutoffFrequency: 100
            NumChannels: 3
    TargetFGOversampleFactor: 10
              FiltGaussian: [1x1 channel2.filtgaussian]
              InterpFilter: [1x1 channel2.interpfilter]
          MaxDopplerShift: 100
```

Underlying Filtered Gaussian Source Component Object:

```
>> hSimulink.RayleighFading.FiltGaussian
ans =
          ImpulseResponse: [1x160 double]
              NumChannels: 3
              LastOutputs: [3x2 double]
                    State: [3x159 double]
                WGNState: [2x1 double]
              QuasiStatic: 0
              EnableProbe: 0
                ProbeFcn: @probe
                  SetLock: 0
            NumSampOutput: 0
        OutputSamplePeriod: 1.0000e-003
          CutoffFrequency: 100
        OversamplingFactor: 10
        ImpulseResponseFcn: @jakes
                TimeDomain: [1x160 double]
            NumFrequencies: 1024
            Autocorrelation: [1x1 channel2.sigresponse]
              PowerSpectrum: [1x1 channel2.sigresponse]
                Statistics: [1x1 channel2.sigstatistics]
```

In some applications, the user may be provided the ability to modify the state of a selected block by modifying the data in the associated data file or object.

Figure 5:
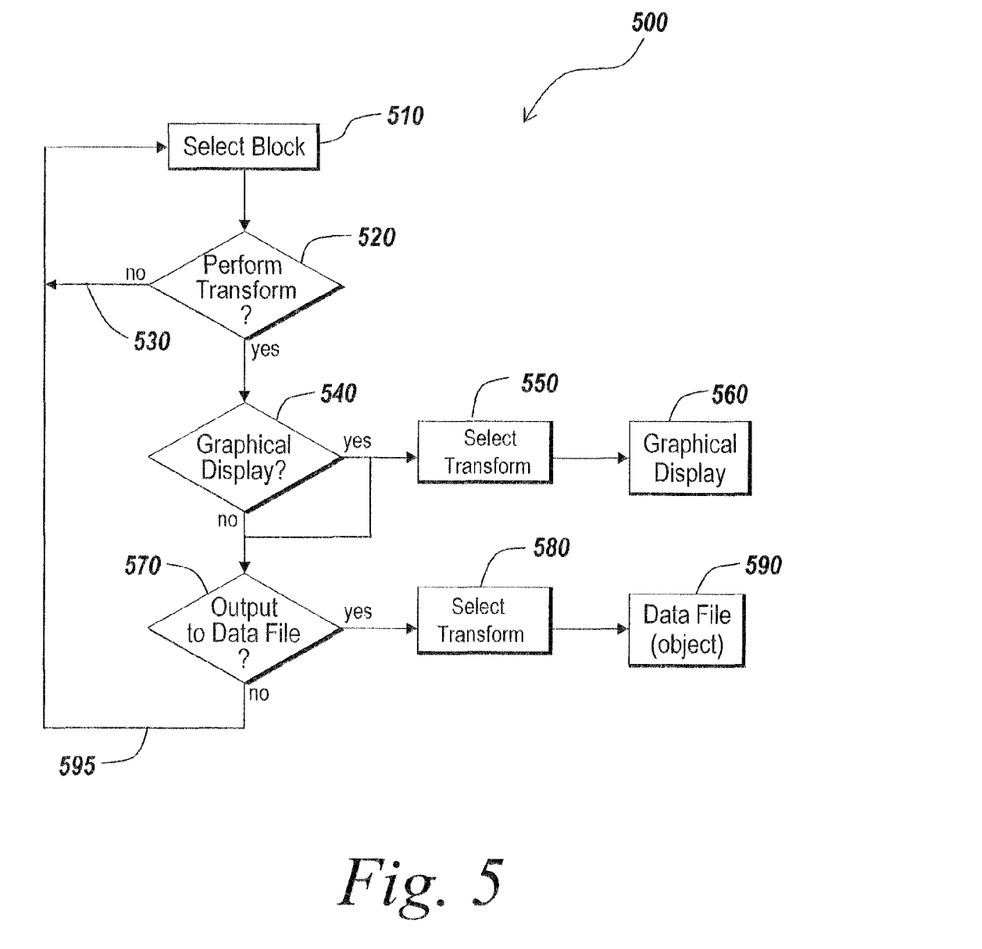
FIG. 5 is an exemplary flowchart of a process of outputting state information of a selected block.

FIG. 5 depicts an exemplary flowchart 500 of the process of outputting state information of a selected block as described above. First a block containing state information is selected by a user 510. The user then decides if functional transforms will be performed and the results outputted from the block 520. If no transform is to be performed then the user may select another block and begin the process again 530. If a transform is to be performed and the result outputted, then the user selects if it will be as to graphical display 540. If the transformation result is going to be outputted as a graphical display, the user may be provided the option of selecting which functional transformations will be performed 550, and a graphical display is generated 560. Regardless if a graphical display output is selected or not, the user selects if the transformation result is outputted to a data file 570. If a functional transformation is going to be performed and the result outputted to a data file, the user may be provided with the option of selecting which transformations to be performed, and the result it outputted to a data file 590. If no transformation is to be performed with the results outputted to a data file, then another block may be selected and the process begun again 595. The selection process may be performed using a graphical user interface such as the dialog box described above and shown in FIG. 4. An example of a data file would be an object in MATLAB as described above.

Figure 6:
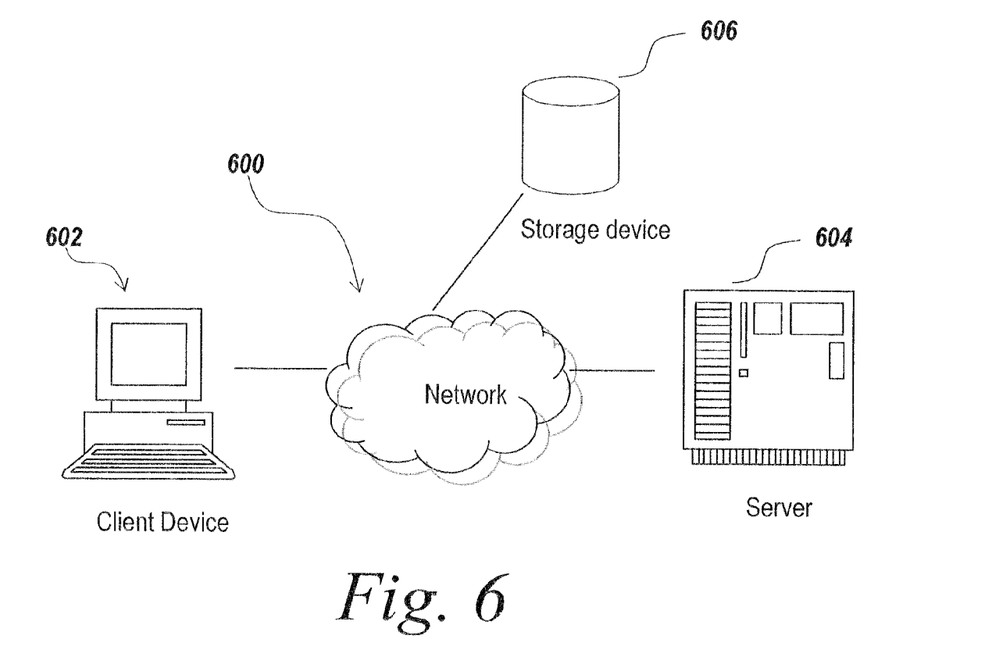
FIG. 6 illustrates a client-server environment suitable for practicing an illustrative embodiment of the present invention

The examples to this point have focused primarily on the system where the graphical modeling environment was on a local electronic device. The graphical modeling environment may of course also be implemented on a network 600, as illustrated in FIG. 6, having a server 602 and a client device 604. Other devices, such as a storage device 606, may also be connected to the network.

In one such embodiment a system for generating and displaying a graphical modeling application, comprises a distribution server for providing to a client device, a block containing state information; and a client device in communication with the distribution server. Here the distribution server provides a client device, such as an electronic device discussed above, with a block containing state information. This block may be part of a block set available to the client on the server. The client may then use the block, containing state information, in a block diagram for a dynamic system.

In another embodiment, the server may execute the graphical modeling environment. A user may then interact with the graphical modeling interface on the server through the client device. In one example of such a system a server and client device are provided. The server is capable of executing a graphical modeling environment, wherein the graphical modeling environment provides a block diagram model of a dynamic system. The client device is in communication with the server over a network. A block, of the block diagram of a dynamic model, containing state information is selected at the server from the client device. A functional transformation may then be performed and the results outputted from the selected block on the server to the client device.

It will be understood by one skilled in the art that these network embodiments are exemplary and that the functionality may be divided up in any number of ways over a network.

The proceeding examples have focused primarily on communication related application but it will be apparent to one skilled in the art that there are numerous other fields and application the present invention would be suitable. Some examples include but are not limited to, wireless communication models, time varying filters and equalizers models, Environmental condition models, plant models, and mechanical models.

The present invention has been described relative to illustrative embodiments. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

What is claimed is:

1. A computer-implemented method comprising:
    transforming, using a computer, state information of an entity of a model, where:
        the entity has an input port for receiving an input and an output port for providing an output, and
        the state information is distinct from the input and the output;
    performing, using the computer, a mathematical transformation on the state information of the entity;
    producing, using the computer, a result using the mathematical transformation, the result produced without modifying the input and the output of the entity; and
    outputting by reference, using the computer, the result without using a port of the entity.

2. The method of claim 1, wherein the result includes a dynamic representation of the state information of the entity.

3. The method of claim 1, wherein the result is provided during an execution of the model.

4. The method of claim 1, wherein the mathematical transformation is an identity transformation.

5. The method of claim 1, wherein the mathematical transformation is at least one of:
    a path gain evolution, matched filter bound, phasor trajectory, composite narrow band trajectory, channel block impulse response, channel frequency response, scattering function, power delay profile, Doppler spectrum, frequency correlation function, time correlation function, mean delay, RMS delay spread, mean Doppler shift, RMS Doppler shift, coherence bandwidth, coherence time, fade distribution, level crossing rate, average fade duration, or zero crossing rate.

6. The method of claim 1, wherein the result is outputted to a file or a display device.

7. The method of claim 1, wherein the entity is represented by a graphical block in a graphical block diagram of the model and wherein the method further comprises:
    displaying the graphical block in a manner that indicates the result was produced from the state information of the entity.

8. The method of claim 7, wherein the graphical block is colored to indicate that the result was produced from the state information of the entity.

9. The method of claim 1, wherein the state information of the entity includes one or more snapshots of a state associated with the entity and where the method further comprises:
    displaying a number of snapshots of the state associated with the entity that is included in the state information of the entity.

10. One or more non-transitory computer-readable storage media for storing computer-executable instructions executable by processing logic, the media storing one or more instructions for:
    transforming state information of an entity of a model, where:
        the entity has an input port for receiving an input and an output port for providing an output, and
        the state information is distinct from the input and the output;

performing a mathematical transformation on the state information of the entity;

producing a result using the mathematical transformation, the result produced without modifying the input and the output of the entity; and outputting by reference the result without using a port of the entity.

11. The media of claim 10, wherein the result includes a dynamic representation of the state information of the entity.

12. The media of claim 10, wherein the result is provided during an execution of the model.

13. The media of claim 10, wherein the mathematical transformation is an identity transformation.

14. The media of claim 10, wherein the entity is represented by a graphical block in a graphical block diagram of the model and wherein the media further comprises one or more instructions for:

displaying the graphical block in a manner that indicates the result was produced from the state information of the entity.

15. The media of claim 10, wherein the state information of the entity includes one or more snapshots of a state associated with the entity and where the media further comprises one or more instructions for:

displaying a number of snapshots of the state associated with the entity that is included in the state information of the entity.

16. A system comprising:

a processor for:

transforming state information of an entity of a model, where:

the entity has an input port for receiving an input and an output port for providing an output, and the state information is distinct from the input and the output;

performing a mathematical transformation on the state information of the entity;

producing a result using the mathematical transformation, the result produced without modifying the input and the output of the entity; and outputting by reference the result without using a port of the entity.

17. The system of claim 16, wherein the processor further executes the model and the result is provided during the execution of the model.

18. The system of claim 16, wherein the entity is represented by a graphical block in a graphical block diagram of the model and wherein the processor further:

displays the graphical block on a display device, wherein the graphical block is displayed in a manner that indicates the result was produced from the state information of the entity.

* * * * *